(12) United States Patent
Enachescu et al.

(10) Patent No.: US 6,714,017 B2
(45) Date of Patent: Mar. 30, 2004

(54) METHOD AND SYSTEM FOR INFRARED DETECTION OF ELECTRICAL SHORT DEFECTS

(75) Inventors: Marius Enachescu, Richmond, CA (US); Sergey Belikov, Palo Alto, CA (US); Stephen F. Meier, Fremont, CA (US)

(73) Assignees: Candescent Technologies Corporation, Los Gatos, CA (US); Candescent Intellectual Property Services, Inc., Los Gatos, CA (US)

( * ) Notice: Subject to any disclaimer, the term of this patent is extended or adjusted under 35 U.S.C. 154(b) by 0 days.

(21) Appl. No.: 09/727,952

(22) Filed: Nov. 30, 2000

(65) Prior Publication Data

US 2002/0093354 A1 Jul. 18, 2002

(51) Int. Cl.[7] .............................. G01R 31/00; G01J 5/02
(52) U.S. Cl. .................... 324/501; 324/770; 250/341.8
(58) Field of Search ................................ 324/501, 133, 324/702, 703, 770, 500, 158.1, 404; 250/330, 338.1, 341.7, 341.8; 430/944

(56) References Cited

U.S. PATENT DOCUMENTS

| | | | | | |
|---|---|---|---|---|---|
| 4,733,175 A | * | 3/1988 | Levinson | .................... | 324/500 |
| 5,307,077 A | * | 4/1994 | Brannigan et al. | .......... | 343/720 |
| 5,424,605 A | * | 6/1995 | Lavoi | ......................... | 313/422 |
| 5,432,461 A | * | 7/1995 | Henley | ....................... | 324/770 |
| 5,463,216 A | * | 10/1995 | Van Berkel | ............. | 250/208.1 |
| 5,730,634 A | * | 3/1998 | Seko | ............................. | 445/3 |
| 5,751,262 A | * | 5/1998 | Browning et al. | ...... | 324/754 X |
| 5,816,703 A | * | 10/1998 | Yamazaki et al. | ............. | 374/4 |
| 6,046,429 A | * | 4/2000 | Datta | .................... | 219/121.69 |
| 6,111,424 A | * | 8/2000 | Bosacchi | .................... | 324/770 |

OTHER PUBLICATIONS

Trishenkov, M. A. et al. "IR camera–based New Approach for Characterization of semiconductor Materials and Devices" Aug. 30, 1998.*
Kaplan, Herbert, Practical Applications of Infrared Thermal Sensing and Imaging Equipment, SPIE, 1999, table of contents and summary.*
Alicandro, Chris. "Thermography in the Microelectronics Industry" Evaluation Engineering, Aug. 1999, pp 1–2.*
Little, Doug, "Thermography Receives a Warm Welacome From Microelectronics Industry" Cahners Business Information. Mar. 2001.pp 1–2.*

* cited by examiner

*Primary Examiner*—Anjan K. Deb

(57) ABSTRACT

A method and system for detecting electrical short circuit defects in a plate structure of a flat panel display, for example, a field emission display (FED) is disclosed. In one embodiment, the process first applies a stimulation to the electrical conductors of the plate structure. Next, the process creates an infra-red thermal mapping of a cathode region of the FED. For example, an infra-red array may be used to snap a picture of the cathode of the FED. Then, the process analyzes the infra-red thermal mapping to determine a region of the FED which contains the electrical short circuit defect. Another embodiment localizes the defect to one sub-pixel by performing an infra-red mapping of the region which the previous IR mapping process determined to contain the electrical short circuit defect. Then, the process analyzes this infra-red mapping to determine a sub-pixel of the FED which contains the electrical short circuit defect.

44 Claims, 9 Drawing Sheets

METHOD AND SYSTEM FOR INFRARED DETECTION OF ELECTRICAL SHORT DEFECTS

TECHNICAL FIELD

The present invention generally pertains to the field of flat-panel displays. More particularly, the present invention is related to a technique for detecting electrical short circuit defects in a baseplate structure of a display.

BACKGROUND ART

The baseplate structure of flat panel displays of the field emission display (FED) variety comprise a number of emitter electrodes, which may run in parallel on a baseplate. Above these are a number of control or gate electrodes, which may run parallel to the emitter electrodes. Between the electrodes reside electron emissive elements or emitters. By applying a potential difference between selected gate electrodes and emitter electrodes, the electron emitters may be made to fire electrons at a phosphorescent display screen, thus illuminating the screen.

The screen of flat panel displays may consist of numerous sub-pixels, which are red, blue, or green picture elements. Each sub-pixel may be separately controlled by selecting exactly one of the control (gate) electrodes and one of the emitter electrodes. For example, by selecting a given gate (e.g., column) electrode and an emitter (e.g., row) electrode, a sub-pixel at the electrode intersection may be controlled. There may be thousands of electron emissive elements corresponding to each sub-pixel.

It is possible for newly manufactured baseplate structures of FEDs to have an electrical short circuit defect between a control (gate) electrode and an emitter electrode. If this happens, not only is control over the sub-pixel at the intersection of the electrodes lost, but all of the sub-pixels on the entire column and row associated with the electrodes may be lost as well. For example, the electrical short circuit defect will electrically connect the gate (column) electrode and the emitter (row) electrode. Thus, these two electrodes can no longer be used to create the potential difference necessary to fire any of their electron emitters. Essentially, the entire display is ruined when an entire column and an entire row of sub-pixels are lost due to an electrical short circuit defect. It is also possible for an electrical short circuit defect to form between two row electrodes or between two column electrodes. When any such electrical short circuit defects form, additional cathode processing steps are unlikely to be successfully completed.

Unfortunately, such defective electrical short circuits are all too common in newly manufactured baseplate structures of FEDs. For example, during the manufacturing process many layers are deposited and considerable etching of the layers is done. During such processing, it is possible for many defects to form. Additionally, the manufacturing clean room may have contaminants, which may lead to formation of electrical short circuit defects.

One conventional method for detecting electrical short circuit defects is to apply a voltage to the FED baseplate before the phosphorescent screen is attached and measure the magnetic field. For example, such a method is disclosed in U.S. Pat. No. 6.323.653, issued Nov. 27, 2001 to Field, et al., entitled "Magnetic Detection of Short Circuit Defects in Plate Structure". However, magnetic detection of defects has several shortcomings. First of all, a magnetic head must be scanned across the FED baseplate at a very close range. It is very difficult to control the range between the magnetic head and the FED baseplate and head crashes are highly possible. Secondly, the strength of magnetic field is proportional to the current which generates it. As a defect with a high resistance will have a low current flowing through it, the associated magnetic field will be low—perhaps too low to detect. Additionally, the resolution of the magnetic method may be unable to locate the exact sub-pixel which contains the electrical short circuit defect. Consequently, additional time is spent by an operator visually scanning for signs of a defect. Also, if the electrical short circuit defect does not have a visual signature, the defect cannot be visually located. Furthermore, when two defects are located in close proximity, for example, a few micrometers apart, the magnetic detection method is unable to resolve the two due to the wide magnetic signal. Additionally, the magnetic head must be scanned over the TAB bonding region for both rows and columns of the display at very slow speeds, which is a time consuming process.

Thus, a need has arisen for a method and system for detecting electrical short circuit defects in a baseplate structure of a field emission display (FED). A still further need exists for detecting such defects automatically. A still further need exists for detecting such defects with sub-pixel accuracy. A further need exists for a system for detecting defects over a wide range of resistances. A still further need exists for such a method and system which is fast, accurate, and reliable.

SUMMARY

Embodiments of the present invention provide for a method and system for detecting electrical short circuit defects in a baseplate structure of a thin cathode ray tube display (e.g., a field emission display (FED)). Embodiments provide for such a system which detects such defects with sub-pixel accuracy. Embodiments provide for such a system which automatically detects such defects. Embodiments provides for such a method and system which detects defects over a wide range of resistances. Embodiments provide for such a method and system which is fast, accurate, and reliable.

A method and system for detecting electrical short circuit defects in a plate structure of a flat panel display is disclosed. For example, the display may be a field emission display (FED). In one embodiment, the process first applies a stimulation to electrical conductors of the plate structure. For example, a voltage differential is applied between the gate electrodes and the emitter electrodes of the field emission display (FED). In another embodiment, the stimulus is applied between two gate electrodes or two emitter electrodes. Next, the process creates an infra-red thermal mapping of a cathode region of the FED. For example, an infra-red array may be used to snap a picture of the cathode of the FED, alternatively, the FED may be scanned. Then, the process analyzes the infra-red thermal mapping to determine a region of the FED which contains the electrical short circuit defect.

Another embodiment applies a pre-determined voltage between electrodes of the plate structure to create a measurable temperature change in the electrical short circuit defect region, given the specific heat of the electrical short circuit defect region and the thermal sensitivity of the IR mapping.

Another embodiment waits a predetermined period of time after applying the stimulation before creating the infra-red thermal mapping. Therefore, the temperature change of the region of the plate structure containing the electrical short circuit defect is detectable with the IR mapping, given the specific heat of the region, the stimulus applied to the plate structure, and the thermal sensitivity of the IR mapping.

Another embodiment provides for a process which identifies the defect with sub-pixel accuracy by performing a second or more infra-red mapping of the region which a previous IR mapping process determined to contain the electrical short circuit defect. Then, the process analyzes this infra-red mapping to determine a sub-pixel of the plate structure which contains the electrical short circuit defect.

Another embodiment provides for a process in which an IR mapping process found an electrical short circuit defect to be in a point-like region. This process may comprise performing a second or more IR mappings of the point-like region to localize the electrical short circuit defect within the point-like region. In this fashion, the process may identify the electrical short circuit defect with sub-pixel accuracy within the point-like region.

Yet another embodiment covers a case in which an IR mapping process found an electrical short circuit defect to be in a region comprising a single line. This embodiment adds the step of evaluating the gradient of temperature with respect to distance along the line, thus automatically determining the defect to be in a sub-pixel within the region. A different embodiment handles this case by performing the step of visually/manually scanning the line-like region to find the defect.

Still another embodiment detects interruptions along an electrode. In this embodiment, a voltage is applied across opposite ends of a number of electrodes. If there is an interruption along an electrode, that electrode will not have resistive heating. The temperature difference between an electrode with an open circuit defect and electrodes without the defect may be detected with IR mapping. For example, a line-like region of lower temperature may indicate such an open circuit defect.

Still another embodiment provides for a process which creates an infra-red mapping of a TAB bonding area of the plate structure. This case may be used when an IR mapping process determines that the region containing the electrical short circuit defect forms two intersecting lines. This embodiment analyzes the infra-red mapping of the TAB bonding area to identify two coordinates for the electrical short circuit defect. Then, the process identifies a sub-pixel at the coordinates to localize the defect within the region.

Yet other embodiments provide for automatically substantially eliminating the defect. In one embodiment, the defect is substantially eliminated by directing a laser substantially at the region containing the defect.

Another embodiment provides for a system for identifying defects in a plate structure. The system comprises a plate structure comprising a plurality of electrodes. Furthermore, the system comprises a device operable to impress a potential difference two of the electrodes. The system additionally comprises a first infrared detector operable to detect a temperature difference the region of the plate structure containing the electrical short circuit defect after the potential difference has been applied, wherein the temperature difference is indicative of an electrical short circuit defect. The two electrodes to which the potential difference is applied may be a gate electrode and an emitter electrode, two gate electrodes, or two emitter electrodes.

Another embodiment adds to this system a second infra-red detector operable to localize the defect with sub-pixel accuracy within the region of the FED that the first infrared detector determines to contain the defect. Although the present invention specifically recites the use of a second infrared detector, the present invention is well suited to an embodiment with more or less infrared detectors.

Another embodiment provides for a computer readable medium coupled to a bus in a computer system having a processor. The medium has a computer program stored thereon that when executed by the processor causes the computer system to implement a method for infra-red detection of an electrical short circuit defect in a baseplate structure of a field emission display (FED).

Another embodiment applies a first voltage to a plurality of first electrodes and a second voltage to a plurality of second electrodes of an FED. Then, this embodiment, identifies a region of the cathode which is at a higher temperature than the surrounding area of the cathode to determine the region of the FED which contains the electrical short circuit defect. A different embodiment identifies a region of the cathode which experienced a raise in temperature after the stimulation to locate the electrical short circuit defect.

These and other advantages of the present invention will no doubt become obvious to those of ordinary skill in the art after having read the following detailed description of the preferred embodiments which are illustrated in the various drawing figures.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

A METHOD AND SYSTEM FOR INFRARED DETECTION OF ELECTRICAL SHORT DEFECTS

Figure 1:
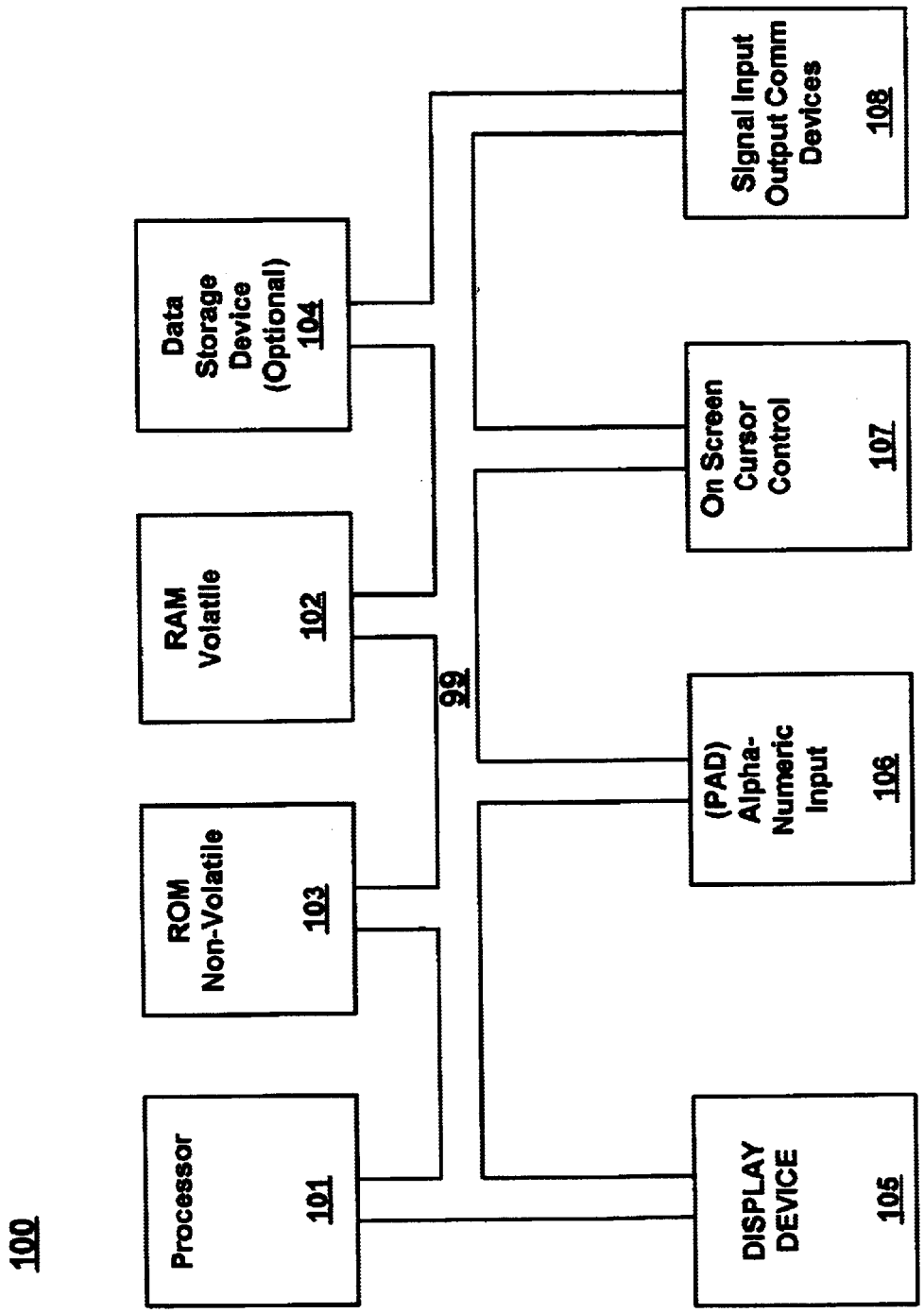
FIG. 1 is a schematic diagram of an exemplary computer system upon which the portions of the present invention may be practiced, in accordance with embodiments of the present invention.

With reference now to FIG. 1, portions of the present method and system for detecting electrical short circuit defects in a baseplate structure of a thin cathode ray tube display (e.g., a field emission display (FED)) are comprised of computer-readable and computer-executable instructions which reside, for example, in computer-usable media of a computer system. FIG. 1 illustrates an exemplary computer system 100 used to perform the method in accordance with one embodiment of the present invention. It is appreciated that system 100 of FIG. 1 is exemplary only in that the present invention can operate within a number of different computer systems including general purpose networked computer systems, embedded computer systems, and stand alone computer systems. Additionally, computer system 100 of FIG. 1 is well adapted having computer readable media such as, for example, a floppy disk, a compact disc, and the like coupled thereto. Such computer readable media is not shown coupled to computer system 100 in FIG. 1 for purposes of clarity.

System 100 of FIG. 1 includes an address/data bus 99 for communicating information, and a central processor unit 101 coupled to bus 99 for processing information and instructions. Central processor unit 101 may be an 80×86-family microprocessor. System 100 also includes data storage features such as a computer usable volatile memory 102, e.g. random access memory (RAM), coupled to bus 99 for storing information and instructions for central processor unit 101, computer usable non-volatile memory 103, e.g. read only memory (ROM), coupled to bus 99 for storing static information and instructions for the central processor unit 101, and a data storage unit 104 (e.g., a magnetic or optical disk and disk drive) coupled to bus 99 for storing information and instructions.

With reference still to FIG. 1, system 100 of the present invention also includes an optional alphanumeric input device 106 including alphanumeric and function keys is coupled to bus 99 for communicating information and command selections to central processor unit 101. System 100 also optionally includes a cursor control device 107 coupled to bus 99 for communicating user input information and command selections to central processor unit 101. System 100 of the present embodiment also includes an optional display device 105 coupled to bus 99 for displaying information. An input/output device 108 coupled to bus 99 controls the flow of information between the system 100 and devices such as Infrared cameras. A more detailed discussion of the embodiments of the present invention, a method and system for detecting electrical short circuit defects in a baseplate structure of a thin cathode ray tube display (e.g., a field emission display (FED)), are found below.

Figure 2:
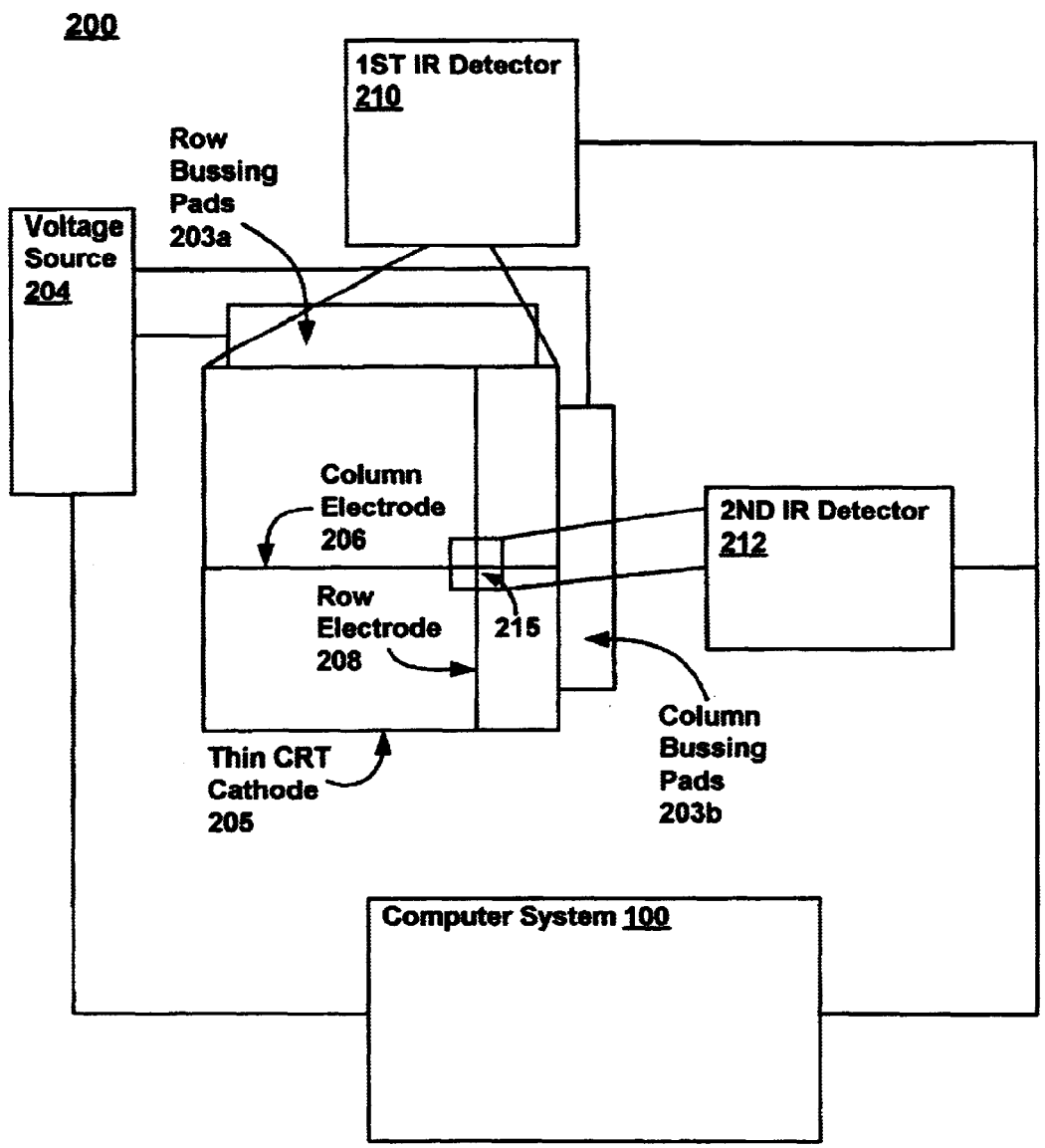
FIG. 2 is a schematic diagram of an exemplary system for identifying electrical short circuit defects in a baseplate structure a flat panel display, in accordance with embodiments of the present invention.

FIG. 2 illustrates a schematic of an exemplary system 200 for infra-red thermal detection of electrical short-circuit defects 215 in a thin cathode ray tube display 205 (e.g., a field emission display (FED)). The system 200 may be controlled by computer system 100, which directs the voltage source (e.g., device operable to impress a potential difference) 204 to create a voltage differential between a column electrode 206 (e.g., a control or gate electrode) and a row electrode 208 (e.g., an emitter electrode) of the thin CRT cathode 205. The electrodes (208, 206) may be accessed via the column bussing pads 203b and the row bussing pads 203a. Computer system 100 may be incorporated into the passive starring array IR detectors 210, 212. While it is not required to activate all of the electrodes at once, in the preferred embodiment this is done to save time. If an electrical short circuit defect 215 exists between a column electrode 206 and a row electrode 208, the current flowing through the electrode/defect circuit will cause sufficient heating to be detectable by the infra-red thermal arrays (210, 212). The present invention is not limited to detecting electrical short circuit defects 215 between a row electrode 208 and a column electrode 206. In one embodiment, the voltage is applied between two row electrodes 208 to find an electrical short circuit defect 215 between two row electrodes 208. In a similar fashion, electrical short circuit defects 215 between two column electrodes 206 may be located.

Figure 7:
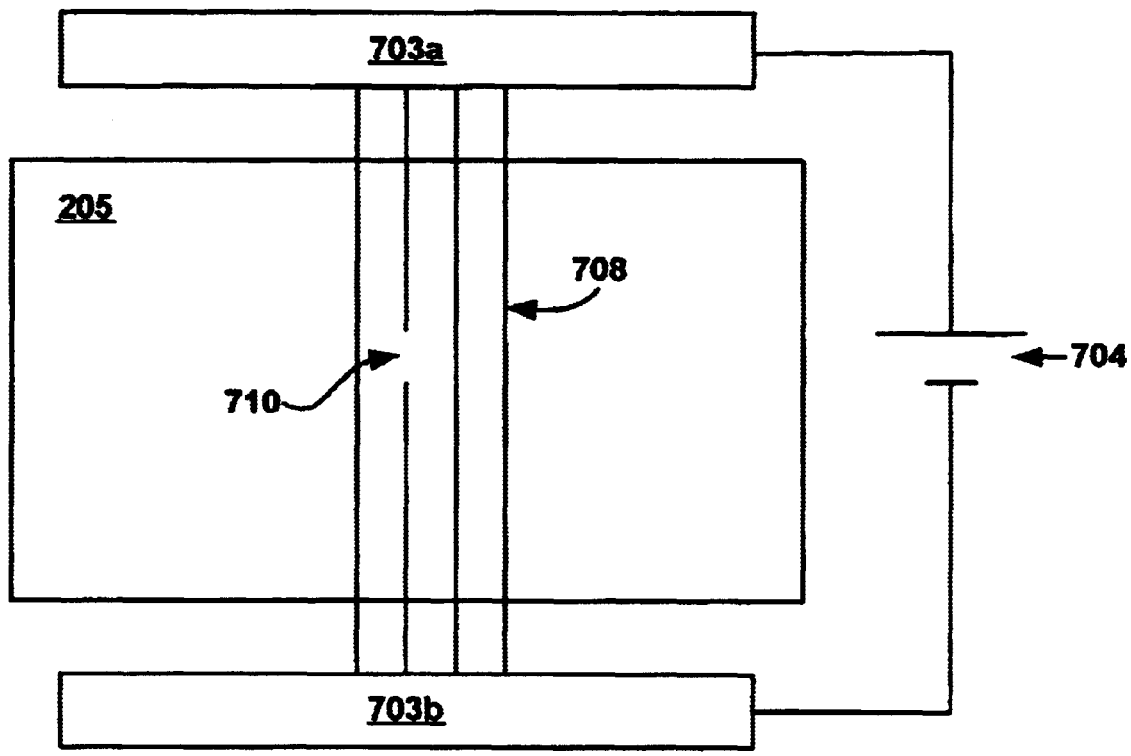
FIG. 7 is an illustration of an exemplary flat panel display showing an electrode with an interruption, which is detectable by performing an embodiment of the present invention.

Referring now to FIG. 7, one embodiment provides for detection of an interruption 710 in an electrode 708. A voltage 704 is applied between bussing areas 703a and 703b. Provided there is no interruption, the electrodes 708 between the bussing areas (703a, 703b) will conduct a current, which is detectable by an increase in temperature. However, no current flows in the electrode 708 with an interruption 710. Thus, electrodes 708 with interruptions will not increase in temperature, but all the others will. The IR detection methods described herein are well-suited to determining that an interruption 710 is present. For example, a line-like region which does not heat, in contrast to the rest of the cathode 205, may be detected upon applying the voltage 704. Embodiments are well suited for detecting an interruption 710 in row 208 or column electrodes 206.

In one embodiment two infra-red (IR) arrays (210, 212) are used. The first IR array 210 is operable to detect a radiance difference between a region of the cathode containing the electrical short circuit defect and the surrounding cathode, where the temperature difference is indicative of an electrical short circuit defect 215. Thus, the first IR camera 210 determines the location of the electrical short circuit defect 215 to within a region of the cathode 205 of the thin CRT. This region may contain more than one sub-pixel. Then, the second IR camera 212 is used to create a thermal mapping which, when analyzed, may localize the electrical short circuit defect 215 to one particular sub-pixel, using appropriate IR optics. Thus, embodiments of the present invention are able to find an electrical short circuit defect 215 with sub-pixel accuracy. In one case, the electrical short circuit defect 215 creates a point-like thermal region. For example, when the linear resistance of the electrical short circuit defect 215 is significantly greater than the linear resistance of the electrodes (208, 206), the electrical short circuit defect 215 may become hotter than any other spot on the thin CRT cathode 205, and thus be detectable by the infra-red devices (210, 212) as a single point. Other cases result in line-like thermal regions.

The present invention is well suited to using a variety of passive starring array infrared detectors 210, 212, such as, for example, Indium Antimonide IR detectors, Mercurium Cadmium Telluride IR detectors, microbolometer IR detectors, or the like. Embodiments may also scan to collect IR information, although snapping IR pictures is preferred. While FIG. 2 shows two IR cameras (210, 212), the present invention is well suited to operating with any number of IR cameras.

It may be shown that electrical short circuit defects 215 may have resistances high enough to create temperature changes greater than the thermal sensitivity of an infra-red detection device (e.g., IR detection device 210, 212). Infra-red devices are available with sensitivity as fine as 0.02 degrees Celsius. Table 1 shows electrical short circuit defect temperature effects substantial greater than 0.02 degrees.

Table 1 illustrates the change in temperature which may be expected when equilibrium is reached after a given voltage is applied between the electrodes (e.g., between a row electrode 208 and a column electrode 206, between two column electrodes 206, or between two row electrodes 208) for a given total resistance. The total resistance is the resistance of the electrical short circuit defect 215 and the gate (206) and emitter (208) electrodes. To calculate the dissipation of heat to the surrounding air, a combined exposed surface area (A) of $10^{-5}$ square meters is assumed for the electrical short circuit defect 215 and electrodes. Equation 1 may be used to derive the information in Table 1.

$$U^2/R_{total} - h_{air}A(T-T_{air}) = Vc_p dT/dt \qquad \text{Equation 1}$$

Where:

U=Voltage between row electrode 208 and column electrode 206

$R_{total}$=Total Resistance of the electrodes and defect $h_{air}$=Coefficient of Heat Transfer for Convection A=Combined surface area of the electrodes and defect T=Temperature of the heated region $T_{air}$=Temperature of the processing environment V=Volume of combined row electrode 208 and column electrode 206

$c_p$=specific heat of electrode's material, considering them from the same material t=time

TABLE 1

| Voltage | Total Resistance | Temperature Change (Celsius) |
|---|---|---|
| 1 Volt | 30K Ohm | 0.33 Degrees |
| 1 Volt | 100K Ohm | 0.1 Degrees |
| 2 Volts | 30K Ohm | 1.33 Degrees |
| 2 Volts | 100K Ohm | 0.4 Degrees |
| 3 Volts | 30K Ohm | 3 Degrees |
| 3 Volts | 100K Ohm | 0.9 Degrees |
| 4 Volts | 30K Ohm | 5.3 Degrees |
| 4 Volts | 100K Ohm | 1.6 Degrees |

TABLE 1-continued

| Voltage | Total Resistance | Temperature Change (Celsius) |
|---|---|---|
| 5 Volts | 30K Ohm | 8.3 Degrees |
| 5 Volts | 100K Ohm | 2.5 Degrees |

One embodiment of the present invention looks for temperature changes in a pre-determined range indicative of an electrical short circuit defect 215. Table 1 and Equation 1 may be used to determine a suitable change in temperature, as well as voltage to apply.

Figure 3:
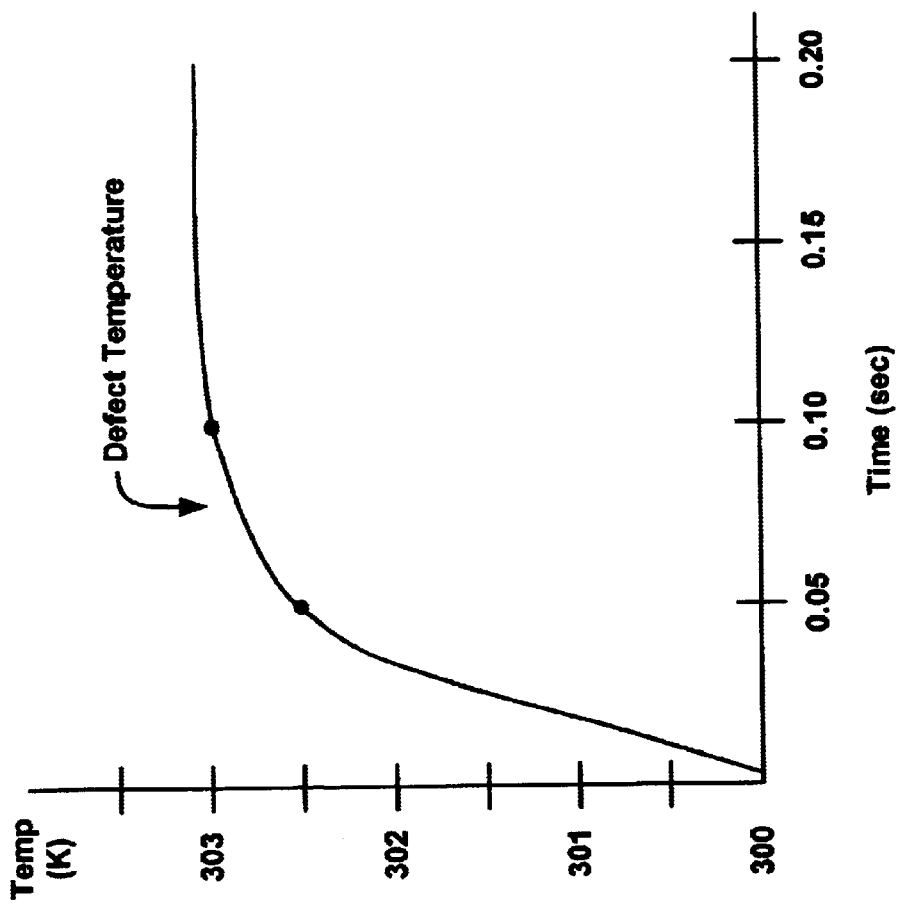
FIG. 3 is a graph illustrating temperature of the defective region verses time, after a voltage has been applied to the electrodes, according to an embodiment of the present invention.

It may be shown that the temperature of the defect/electrode circuit is very close to its equilibrium value in a very short period of time. FIG. 3 is a graph obtained by simulation/modeling illustrating Temperature versus time. To arrive at the values in FIG. 3, it is assumed that 3 Volts are applied between the electrodes (208, 206), and the total resistance of the defect 215 and the electrodes is 30 K Ohm. For example, the defect 215 and each electrode may have a 10 K Ohm resistance. The defect 215 and electrodes combined are assumed to have a volume of $10^{-12}$ cubic meters, and an area of $10^{-5}$ square meters. The air above the defect 215 is assumed to be 300 degrees Kelvin. As the graph shows, within about 0.1 seconds the temperature of the defect 215 is nearly at its final value of approximately 303 degrees Kelvin. Thus, it quickly rises to a temperature considerably greater than the 0.02 degree (Kelvin) sensitivity of the infra-red device. If desired, the infra-red information may be gathered well before 0.1 seconds has elapsed, as a temperature increase of 0.02 degrees occurs almost instantly.

Equation 2, which may be derived from Equation 1, defines the curve in the graph in FIG. 3:

$$T(t) = b/a + [T(0) - b/a] * e^{-at} \qquad \text{Equation 2}$$

Where 'a'=$(h_{air}*A)/(V*c_p)$; and 'b'=$U^2/(R_{Total}*V*c_p) + (a*T_{air})$. Furthermore, where 'T' is the Temperature of the heated region in Kelvin, '$T_{air}$' is the air temperature in the process environment, 't' is time, '$h_{air}$' is the coefficient of heat transfer for convection, 'A' is the combined surface area of the electrodes and defect 215 that is exposed to air, 'V' is the volume of the electrodes and the defect 215, 'U' is the applied voltage, 'e' is the natural exponent, and '$c_p$' is the specific heat capacity of the electrodes (208, 206), considering them from the same material.

In one embodiment a DC voltage is applied. However, the present invention is well suited to applying an AC voltage to cause the electrical short circuit defect 215 to heat. The AC voltage may be chosen at a suitable frequency, based in part on the information in FIG. 3. Additionally, a pulsed signal may be used, correlated to the fast response of the IR signal.

Figure 4A:
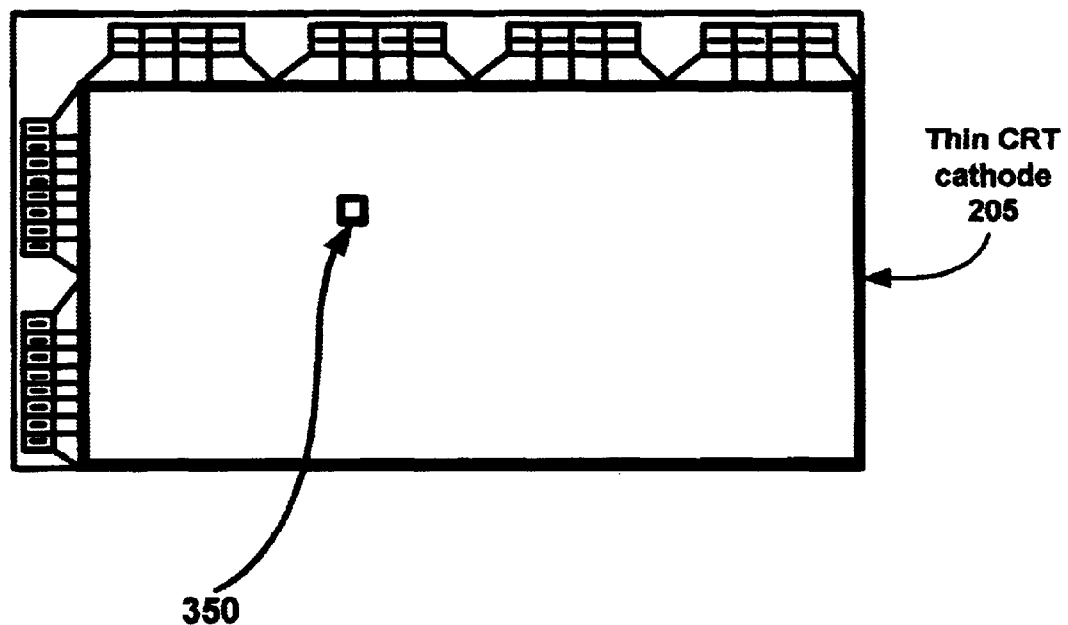
FIG. 4A is an illustration of an exemplary flat panel display showing point-like heating in the cathode, which may occur when performing an embodiment of the present invention.

In some cases, the electrical short circuit defect 215 causes a point-like heating 350 in the cathode 205, as shown in FIG. 4A. In these cases, while the electrical short circuit defect 215 is known to be within this region 350, the region 350 may contain more than one sub-pixel. However, in this case, a second or more IR mappings may be made of the region 350 with the defect to localize the electrical short circuit defect 215 to one sub-pixel. However, the present invention is not limited to always performing a second or more IR mappings.

However, some electrical short circuit defects 215 are more difficult to detect. For example, when the linear resistance of the electrodes (208, 206) is comparable to the linear resistance of the defect 215, then the resistive heating will be approximately the same throughout the entire row/column circuit (e.g., electrode/defect circuit). This means that the infra-red thermal mapping will not show a point-like source (FIG. 4A, 350), but a line-like region defined by the portion of the electrodes (208, 206) which forms the circuit. In some cases both electrodes (208, 206) will show an increase in temperature; however, in other cases only one electrode will show a significant increase. This may be the case if one electrode has a lower resistance than the other, which may be the case if one is substantially wider than the other. The width of the electrode may affect convection cooling as well.

Figure 4B:
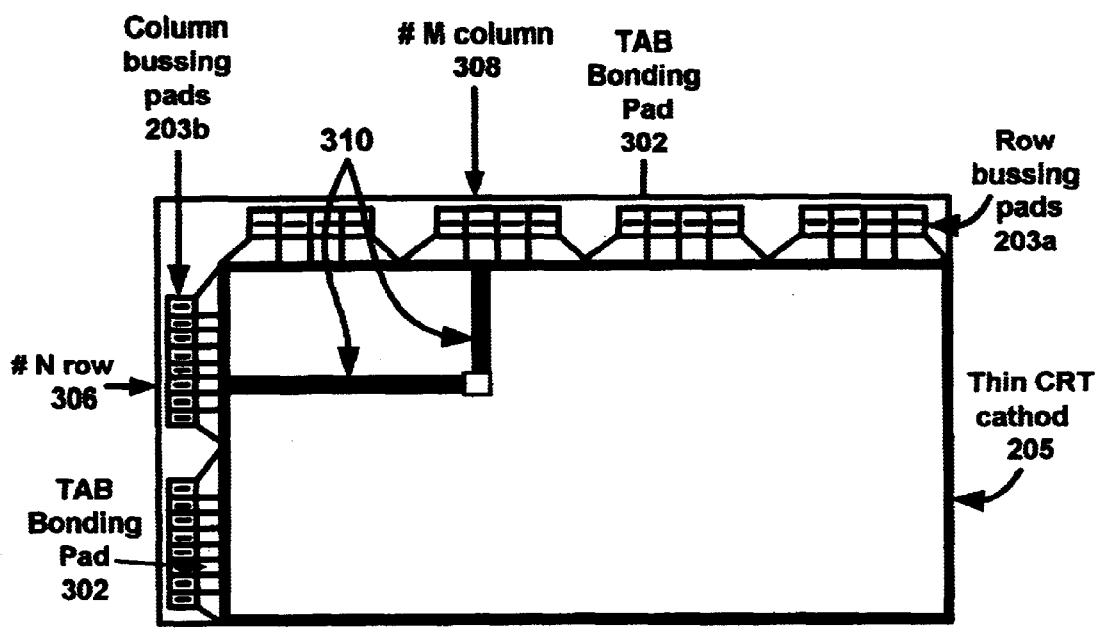
FIG. 4B is an illustration of an exemplary flat panel display highlighting a method that evaluates the TAB bonding region to identify electrical short circuit defects with sub-pixel accuracy, according to an embodiment of the present invention.

FIG. 4B illustrates the heating which may occur on baseplate structure of a thin CRT cathode 205 (e.g., an FED) when the linear resistance of the gate 308 and emitter 306 electrodes are comparable to the linear resistance of the defect 215. In this example, the gate (column) 308 and the emitter (row) 306 electrodes themselves have similar resistances. Consequently, they show similar heating. In this embodiment, electrical short circuit defects 215 are located, with sub-pixel accuracy by snapping or scanning an Infra-red camera (210, 212) over the TAB bonding regions (Pads) 302. This embodiment may be proceeded by a step of initially identifying a line-like defect 310, although the present invention may be performed without that step. From the IR thermal information acquired from the TAB bonding region 302, the precise sub-pixel which contains the electrical short circuit defect 215 may be found from identifying a gate electrode (row) 306 and an emitter electrode (column) 308 of the baseplate.

Figure 4C:
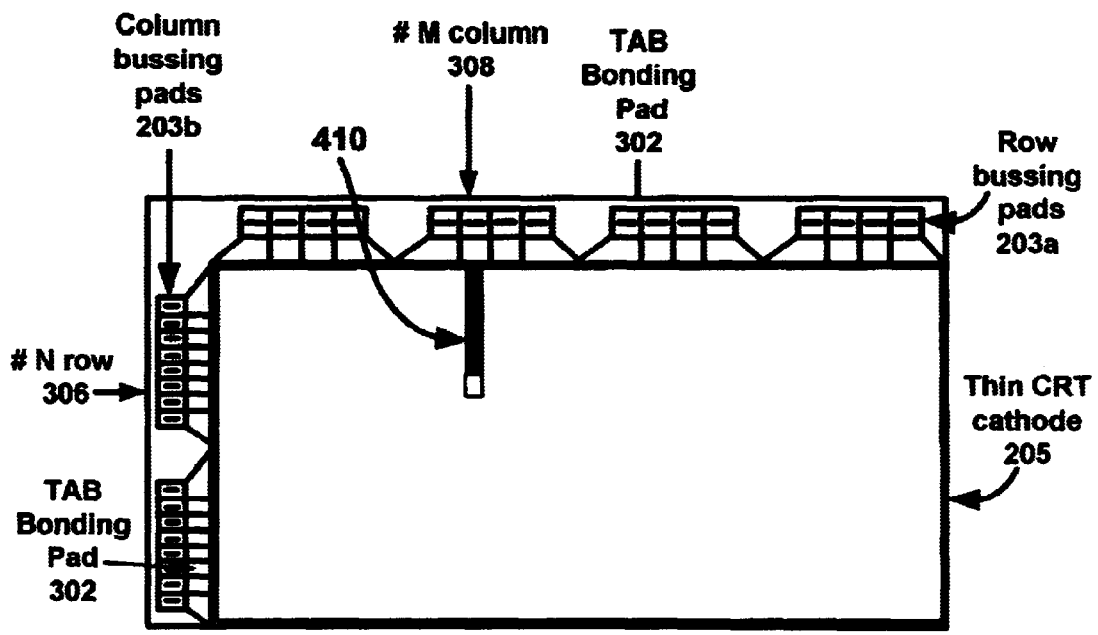
FIG. 4C is an illustration of an exemplary flat panel display highlighting a method that evaluates the temperature gradient at the end of a line defect to identify electrical short circuit defects with sub-pixel accuracy, according to an embodiment of the present invention.

FIG. 4C illustrates a heated region for embodiment in which the electrical short circuit defect 215 linear resistance is comparable to either the gate electrode (row) 306 or emitter electrode (column) 308 linear resistance. However, the linear resistance of the column and the row are not substantially similar. In this case, the thermal heating shows up as a line 410 along either a row 308 (emitter electrode) or a column 306 (gate electrode). This embodiment provides for an method which automatically finds the electrical short circuit defect 215 with sub-pixel accuracy. First, the IR camera 210 is snapped or scanned over the cathode area 205. This reveals the line-like thermal heating 410. The electrode/defect circuit still exists but one electrode does not show significant heating. The defect 215 will be at the end of the electrode (line) that shows heating. Thus, image analysis is performed on the line 410. This analysis primarily evaluates the temperature gradient of the line 410 towards the defect end. This analysis points to the precise sub-pixel in which the electrical short circuit defect 215 is located.

In another embodiment, visual inspection of the line 410 is used to find the exact sub-pixel with the electrical short circuit defect 215. First, the cathode region 205 is scanned/snapped via IR to identify line-like 410 thermal heating, which roughly identifies the electrical short circuit defect 215 location. Next image analyses may be performed on the line to more particularly localize the electrical short circuit defect 215 to a portion of the line 410. Finally, an operator may manually scan visually up and down (or left and right) the line 410 to determine the exact sub-pixel which contains the electrical short circuit defect 215.

When the electrical short circuit defect 215 temperature is slightly higher than the electrodes, the defect image will have enough IR contrast to stand out as a point, after threshold processing. Consequently, detection of the defect is relatively simple, and the methods listed in the discussion of FIG. 4B and FIG. 4C are not necessary.

Figure 5:
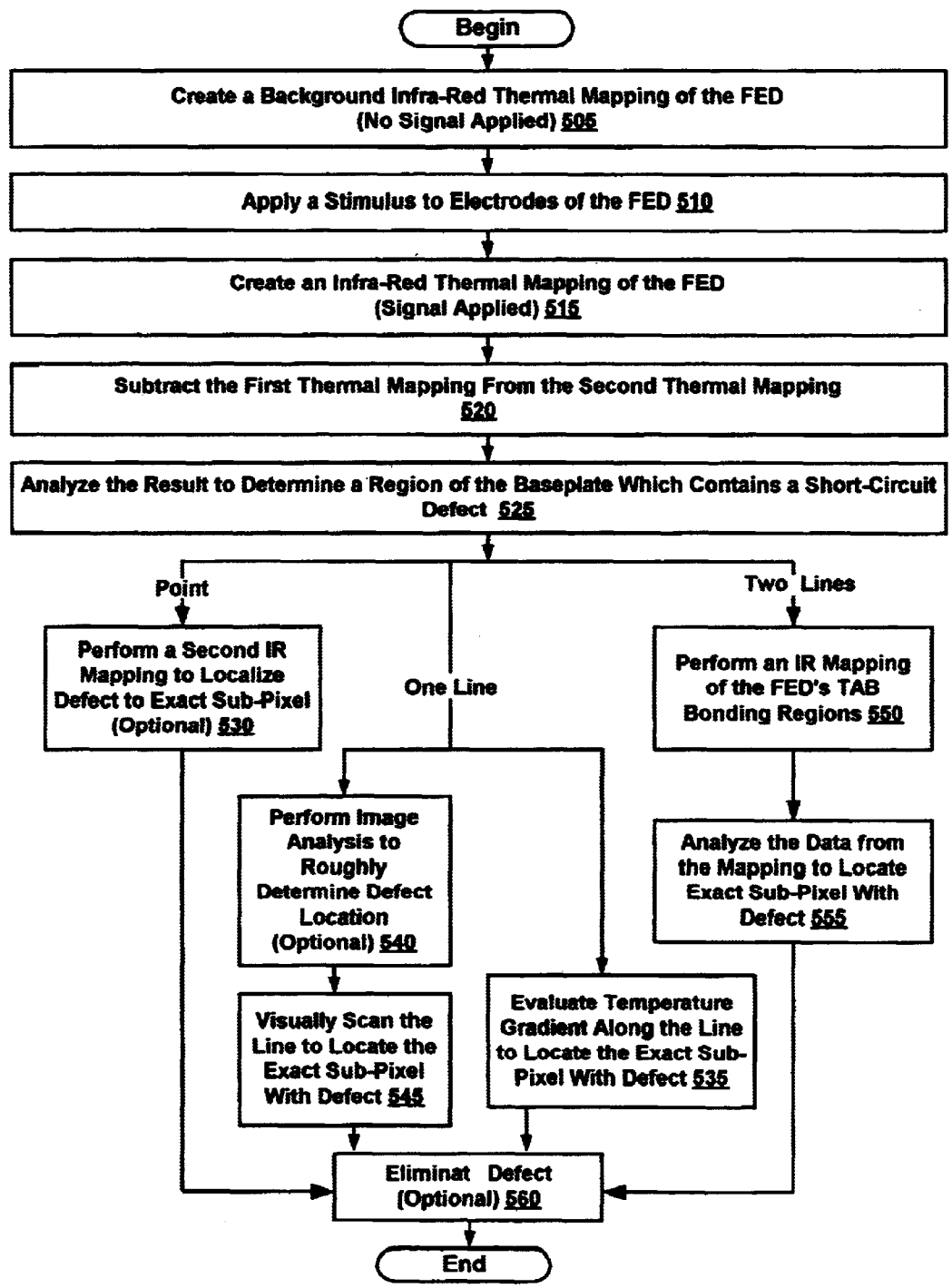
FIG. 5 is flowchart of the steps of a process of detecting and localizing electrical short circuit defects with sub-pixel accuracy, according to an embodiment of the present invention.

FIG. 5 illustrate the steps of a process 500 for identifying electrical short circuit defects 215 in a baseplate structure of a thin CRT (e.g., an FED), using thermal IR detection. In step 505, a background infrared thermal mapping of the baseplate structure is created.

Next, in step 510, a stimulus is applied to the FED. For example, a potential difference is applied between a gate electrode 206 and an emitter electrode 208, such that a current will flow through a circuit formed if an electrical short circuit defect 215 exists between the electrodes. In one embodiment, a negative voltage is applied to all of the gate electrodes 206 while all of the emitter electrodes 208 are positively held, so that the entire FED may be tested at once. However, the present invention is not limited to this method. The present invention is well suited to applying an AC voltage, or a pulsed voltage signal, or the like. Additionally, the present invention is well suited to impressing a voltage between two gate electrodes 206 or between two emitter electrodes 208 to find an electrical short circuit defects between such electrodes.

One embodiment applies a pre-determined voltage to the FED to create a measurable temperature change in the defect region given the specific heat of the region and the thermal sensitivity of the IR mapping. The pre-determined voltage may be derived from Table 1 and Equation 1.

In step 515, to process 500 creates a second infra-red thermal mapping of the cathode region 205 of the FED. In one embodiment, the process waits a pre-determined period of time after applying the stimulation, generally a very short period, before creating the infra-red thermal mapping. Therefore, the temperature change of the region of the FED containing the electrical short circuit defect is detectable with the IR mapping, given the specific heat of the region, the stimulus applied to said FED, and the thermal sensitivity of the IR mapping. FIG. 2 and Equation 2 may be referred to in order to determine suitable time periods to wait after applying the potential. The present invention is well-suited to a wide range of time periods and time related detection techniques.

In step 520, the first thermal mapping, the background image, is subtracted from the second IR mapping, the IR image under applied voltage conditions, to obtain the change in temperature after the stimulus was applied.

Next, in step 525, the result of step 520 is analyzed to determine a region of the FED which contains the electrical short circuit defect 215. This step may, in some cases, determine the exact sub-pixel which contains the electrical short circuit defect 215. However, in many cases the region will contain a number of sub-pixels which may possibly contain the electrical short circuit defect 215. The region may have a variety of configurations, for example a point, a line, or two lines. The present invention is adaptable to handle each case. Next, the process 500 follows the appropriate path depending on which case arises.

In some cases, the electrical short circuit defect 215 cause a point-like heating on the cathode region 205. In these cases the linear resistance of the electrical short circuit defect 215 may be significantly higher than the linear resistance of the electrodes (208, 206). Depending, in part, on the nature (e.g., spatial resolution, as opposed to temperature resolution) of the IR mapping, the exact sub-pixel may be located by analyzing the data produced by the thermal mapping of step 505 through step 525. However, in one embodiment, optional step 530 performs an IR thermal mapping over the region with the electrical short circuit defect 215, with a camera 212 with higher spatial resolution than the first camera 210. Analysis of the thermal mapping localizes the exact sub-pixel that contains the electrical short circuit defect 215. Step 530 may comprise a series of steps similar to step 505 through step 525.

In other cases, the electrical short circuit defect 215 will cause heating along a single line 410, for example, when the linear resistance of the electrical short circuit defect 215 is substantially similar to the linear resistance of one of the electrodes (208, 206). However, the other electrode has a lower resistance, and hence does not dissipate as much heat through heating losses. In this case, to localize the defect 215 to a particular sub-pixel within the region, two alternative methods may be used.

In step 535, the process 500 automatically evaluates the temperature gradient along the line 410 (region). The slope of the curve will drop off considerably at the end of the line 410. The exact sub-pixel with the defect 215 may be identified in this fashion.

Step 540 starts an alternate method to find the sub-pixel when the IR thermal mapping shows a line-like 410 region of heating. In step 540, image analysis is performed on the IR thermal mapping to approximately locate the electrical short circuit defect 215 along the line 410. The image analysis may be similar to that used in step 535, although the present embodiment is not limited to that method.

In step 545, the line is visually scanned by an operator for visible signs of a sub-pixel carrying an electrical short circuit defect 215. This step may be performed without step 540.

The process 500 performs the steps starting at step 550 when the region containing the electrical short circuit defect 215 forms two lines 310. In this case, the linear resistance of the gate electrode 206 and the emitter electrode 208 are comparable and therefore the resistive/thermal heating is being distributed relatively uniformly over the circuit formed by the row-defect-column. In step 550, an IR mapping is made of the TAB bonding area 302 of the FED.

In step 555, the IR thermal mapping or the TAB area 302 is analyzed. The exact gate electrode 206 and emitter electrode 208 that are getting hot can be determined from data from the row 203a and column 203b bussing pads. Thus, the coordinates for the sub-pixel that contains the electrical short circuit defect 215 are found.

In step 560, after the sub-pixel containing the electrical short circuit defect 215 has been identified, the electrical short circuit defect 215 may be eliminated, in an optional step. This step may be performed automatically, for example, by directing a laser at the sub-pixel with the electrical short circuit defect 215. Thus, embodiments provide for a process which automatically finds and eliminates an electrical short circuit defect 215.

Figure 6:
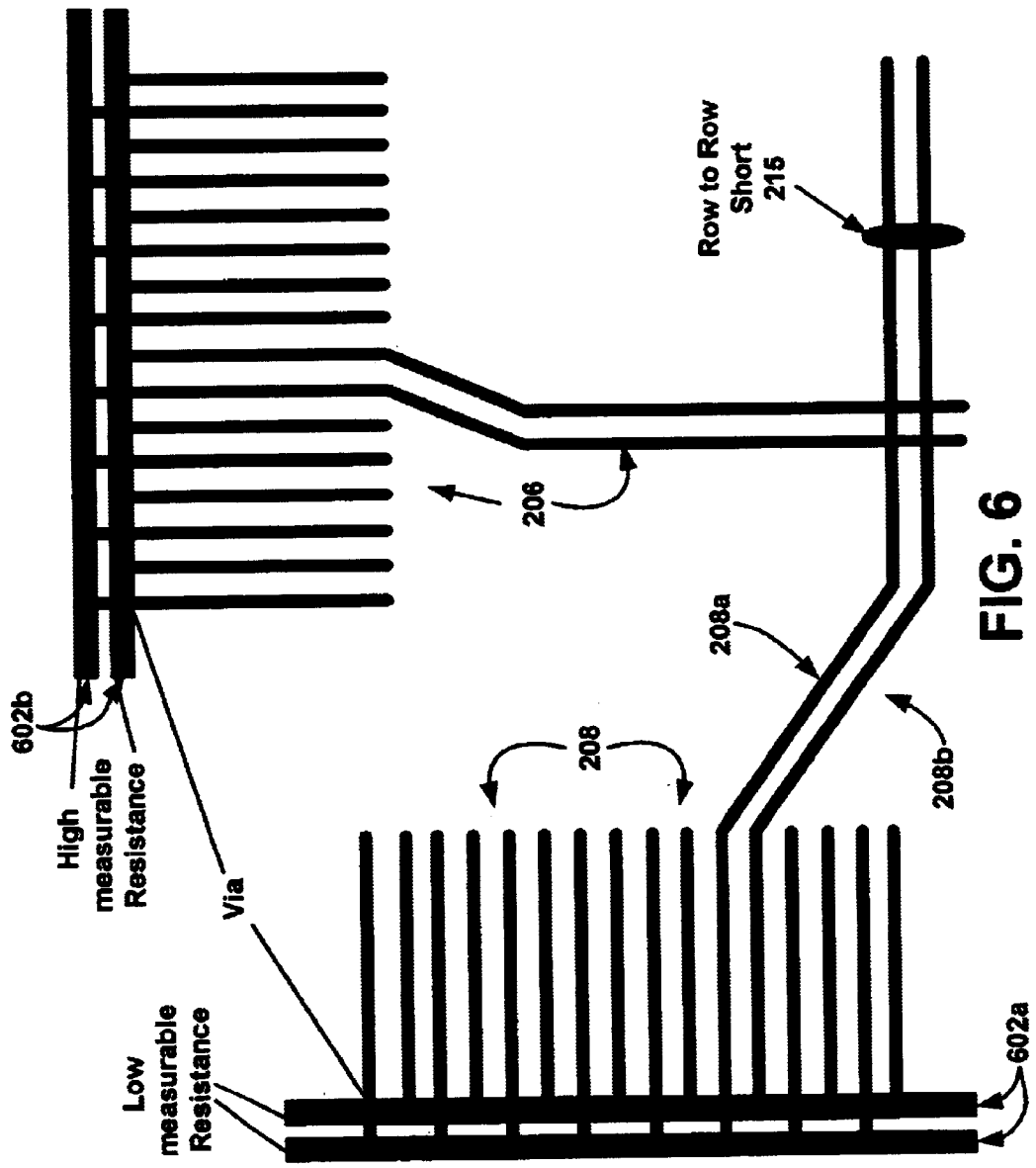
FIG. 6 is an illustration of a portion of electrodes and shorting bars used to impress a voltage between electrodes to detect an electrical short circuit defect between two row electrodes or two column electrodes, according to an embodiment of the present invention.

It is also possible for electrical short circuit defects 215 to exist between two row electrodes 208 or between two column electrodes 206, as opposed to between a row 208 and a column electrode 206. For example, the electrical short circuit defect 205 may be between two gate electrodes or between two emitter electrodes. Embodiments of the present invention are well-suited to locating such electrical short circuit defects 215. FIG. 6 illustrates an electrical short circuit defect 215 between two row electrodes 208a and 208b. Also shown are a pair of shorting bars 602a electrically connecting selected row electrodes 208 and a second pair of shorting bars 602b electrically connecting selected column electrodes 206. For example, each row shorting bar 602a may be connected to every other row electrode 208, such that an interleaved pattern is formed. In this fashion, a potential difference may be impressed between any two adjacent row electrodes 208. However, the present invention is not limited to using only a pair of shorting bars 602, or to using an interleaved pattern.

Still referring to FIG. 6, an embodiment of the present invention applies a voltage difference between the two row shorting bars 602a. For example, voltage source (FIG. 2, 204) is electrically connected to the shorting bars 602a. If an electrical short circuit defect 215 exists between two row electrodes 208, an electrical circuit is formed and a current flows. For example, a current flows through the electrical short circuit defect 215 and portions of row electrode 208a, row electrode 208b, and the row shorting bars 602a. The electrical short circuit defect 215 will heat up, as discussed with the defect 215 between a row electrode 208 and a column electrode 206. In a similar fashion, column to column defects 215 may be detected by applying a voltage between the column shorting bars 602b. The row/row defects 215 and column/column defects 215 may be detected by the infrared mapping methods discussed herein.

Therefore, it will be seen that embodiments of the present invention allow a method and system for detecting electrical short circuit defects in baseplate structure of a thin cathode ray tube display (e.g., a field emission display (FED)). Embodiments provide for such a system which detects such defects with sub-pixel accuracy. Embodiments provide for such a system which automatically detects such defects. Embodiments provides for such a method and system which detects defects over a wide range of resistances. Embodiments provide for such a method and system which is fast, accurate, and reliable.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A method of Infra-red thermal detection of a defect in a plate structure of a flat panel display comprising the steps of:
   a) applying a stimulation to electrical conductors of said plate structure;
   b) creating an infra-red thermal mapping of a cathode of said plate structure; and
   c) analyzing said infra-red thermal mapping to determine a region of said cathode which contains said defect.

2. The method of claim 1 wherein said defect is an electrical short circuit defect.

3. The method of claim 1 wherein said region is a point-like defect.

4. The method of claim 1 wherein said step a) comprises the step of:
   a1) applying a pre-determined voltage to said plate structure to create a measurable temperature change in said region given the specific heat of the region and the thermal sensitivity of said IR mapping.

5. The method of claim 1 wherein said step a) comprises the step of:
   a1) applying a voltage differential between a gate electrode and an emitter electrode of said plate structure.

6. The method of claim 1 wherein said region comprises two lines.

7. The method of claim 6 wherein said step c) comprises the step of:

c1) determining said defect to be within a sub-pixel at the intersection of said two lines.

8. The method of claim 7 further comprising the steps of:
d) creating an infra-red mapping of a TAB bonding area of said flat panel display;
e) analyzing said infra-red mapping of said TAB bonding area to identify two coordinates for said defect; and
f) identifying a sub-pixel at said coordinates as containing said defect.

9. The method of claim 1 further comprising the steps of:
d) performing an infra-red thermal mapping of said region which said step c) determined to contain said defect; and
e) analyzing said infra-red mapping of said region to determine a sub-pixel of said plate structure which contains said defect.

10. The method of claim 1 wherein said region comprises a line of said plate structure.

11. The method of claim 10 further comprising the step of:
d) performing image analysis of said line to approximately locate the sub-pixel which contains said defect.

12. The method of claim 10 further comprising the step of:
d) visually scanning said line to determine the sub-pixel containing said defect.

13. The method of claim 10 further comprising the step of:
d) performing image analysis of said line to determine the sub-pixel containing said defect.

14. The method of claim 13 wherein said step d) comprises the step of:
d1) evaluating the temperature gradient along said line to automatically determine the sub-pixel containing said defect.

15. The method of claim 1 wherein the temperature change of the region after said stimulation is greater than the thermal sensitivity of an infra-red detection device.

16. The method of claim 1 further comprising the step of:
d) substantially eliminating said defect in said region.

17. The method of claim 1 further comprising the step of:
d) automatically substantially eliminating said defect in said region.

18. The method of claim 1 further comprising the step of:
d) substantially eliminating said defect in said region by directing a laser substantially at said region.

19. The method of claim 1 wherein said step b) comprises the step of:
b1) waiting a pre-determined period of time after applying said stimulation before creating said infra-red thermal mapping, wherein the temperature change of said region of said plate structure containing said defect is detectable with said IR thermal mapping, given the specific heat of said region, the stimulus applied to said plate structure, and the thermal sensitivity of said IR mapping.

20. The method of claim 1 wherein said step a) comprises the step of:
a1) applying a voltage differential between two gate electrodes of said plate structure without activating a pixel on either of said two gate electrodes in order to detect a possible short circuit defect between said two gate electrodes.

21. The method of claim 1 wherein said stimulation is a voltage selected from the group consisting of alternating voltage (AC), direct voltage (DC), and pulsed voltage.

22. The method of claim 1 wherein said step a) comprises the step of:

a1) applying a voltage differential between two electrodes of said plate structure which are oriented substantially perpendicular to one another.

23. The method of claim 1 wherein said step a) comprises the step of:
a1) applying a voltage differential between two electrodes of said plate structure which are oriented substantially parallel to one another without activating a pixel on either of said two electrodes in order to detect a possible short circuit defect between said two electrodes.

24. The method of claim 1 wherein said defect is an electrical open circuit defect.

25. The method of claim 24 wherein said region comprises a line-like region.

26. The method of claim 25 wherein said step c) comprises the step of:
c1) determining that said line-like region is at a lower temperature than the surrounding area of said cathode.

27. The method of claim 1 wherein said step a) comprises the step of:
a1) concurrently applying first and second voltages in an interleaved pattern to electrodes of said plate structure.

28. The method of claim 27, wherein said electrodes are gate electrodes.

29. The method of claim 27, wherein said electrodes are emitter electrodes.

30. A system for identifying electrical short circuit defects in a plate structure of a flat panel display comprising:
a plate structure of a field emission display comprising a plurality of electrodes;
a device operable to impress a potential difference between two of said plurality of electrodes;
a first infrared detector operable to detect a temperature difference between a region of said plate structure containing said electrical short circuit defect after said potential difference has been applied, wherein said temperature difference is indicative of an electrical short circuit defect.

31. The system of claim 30 wherein said infrared detector comprises a passive starring array IR detector.

32. The system of claim 30 wherein:
said system further comprises a second infrared detector operable to localize said electrical short circuit defect to a sub-pixel within said region of said plate structure which said first infrared detector determines to contain said defect.

33. The system of claim 32 wherein said first and second infra-red detectors are operable to detect a temperature change indicative of a defective region when a sufficient voltage is applied between said two of said plurality of electrodes.

34. The system of claim 33 where said first and said second infrared detectors are selected from the group consisting of an Indium Antimonide IR detector, a Mercurium Cadmium Telluride IR detector, and a microbolometer IR detector.

35. The system of claim 30 wherein said two of said plurality of electrodes comprise a gate electrode and an emitter electrode.

36. The system of claim 30 wherein said two of said plurality of electrodes comprise two gate electrodes, wherein an electrical short defect between said two gate electrodes is detectable based on said temperature difference detected by said infrared detector.

37. The system of claim 30 wherein said two of said plurality of electrodes comprise two emitter electrodes, wherein an electrical short defect between said two emitter electrodes is detectable based on said temperature difference detected by said infrared detector.

38. In a computer system having a processor coupled to a bus, a computer readable medium coupled to said bus and having stored therein a computer program that when executed by said processor causes said computer system to implement a method of Infra-red thermal detection of an electrical short circuit defect in a field emission display (FED) comprising the steps of:
   a) creating a first infra-red thermal mapping of a cathode region of said FED;
   b) applying a stimulation to said field emission display (FED) to create a current;
   c) creating a second infra-red thermal mapping of said cathode region of said FED;
   d) subtracting said first infra-red thermal mapping from said second infra-red thermal mapping; and
   e) analyzing the result of said step d) to determine a region of said FED which contains said electrical short circuit defect.

39. The computer readable medium of claim 38 wherein said step b) of said method comprises the step of:
   b1) applying a first voltage to a plurality of first electrodes and a second voltage to a plurality of second electrodes.

40. The computer readable medium of claim 39 wherein said first electrodes and said second electrodes are in an interleaved pattern.

41. The computer readable medium of claim 38 wherein said step e) of said method comprises the step of:
   e1) identifying a region of said cathode region which is at a different temperature than the surrounding area of the cathode region to determine said region of said FED which contains said electrical short circuit defect.

42. The computer readable medium of claim 41 wherein said difference in temperature is in a pre-determined range indicative of an electrical short circuit defect, given the applied voltage difference.

43. The computer readable medium of claim 38 wherein said step e) of said method comprises the step of:
   e1) identifying a region of said cathode region which experienced a raise in temperature after said stimulation to determine said region of said FED which contains said electrical short circuit defect.

44. The computer readable medium of claim 43 wherein said raise in temperature is in a pre-determined range indicative of an electrical short circuit defect, given the applied voltage difference.

* * * * *